United States Patent [19]

MacWilliams et al.

[11] Patent Number: 4,508,204

[45] Date of Patent: Apr. 2, 1985

[54] GRAVITY FEED CHUTE

[75] Inventors: David MacWilliams, Purbrook; Leonard J. Rigbey, Winchester, both of England

[73] Assignee: International Business Machines Corporation, Armonk, N.Y.

[21] Appl. No.: 551,227

[22] Filed: Nov. 14, 1983

[30] Foreign Application Priority Data

Nov. 30, 1982 [EP] European Pat. Off. ........ 82306349.0

[51] Int. Cl.³ .............................................. B65G 11/20
[52] U.S. Cl. ...................................................... 193/40
[58] Field of Search ............... 193/32, 40, 2 R, 25 FT

[56] References Cited

U.S. PATENT DOCUMENTS

| 1,658,724 | 2/1928 | Kendall | 193/2 R |
| 2,622,545 | 12/1952 | Hummel | 193/2 R X |
| 2,995,504 | 8/1961 | Taylor | 193/32 X |
| 3,068,626 | 12/1962 | Ianuzzi et al. | 193/2 R X |
| 4,314,628 | 2/1982 | Calbert et al. | 193/2 R |

FOREIGN PATENT DOCUMENTS

| 1259860 | 7/1959 | France | 193/2 R |
| 784276 | 10/1957 | United Kingdom | 193/2 R |
| 1070004 | 5/1967 | United Kingdom | 193/2 R |

Primary Examiner—Jeffrey V. Nase
Assistant Examiner—L. E. Williams
Attorney, Agent, or Firm—D. Kendall Cooper

[57] ABSTRACT

A chute for gravity feeding a plurality of like electrical components (1) to a pick-up station of a robotic controlled automatic assembly system comprises guide rails (2,3) down which components slide with their pins (13) extending between the rails. The rails are shaped to provide a downwardly inclined straight track (5) leading into a horizontal track (6) comprising the pick-up station from which the components are taken by the robot. The transition from the inclined track (approximately 30 degrees to the horizontal) to the straight track, although smooth, is quite abrupt and ensures that the next component is successfully fed from the inclined to the horizontal section of the chute each time its predecessor is removed from the pick-up station. Since the length of the horizontal track is such that only one component can be accommodated at a time, accurate positioning of the component in the pick-up station for access by the robot is guaranteed.

1 Claim, 3 Drawing Figures

GRAVITY FEED CHUTE

BACKGROUND OF THE INVENTION

The present invention relates to a chute for gravity feeding a plurality of like components to a pick-up station of a robotic or machine controlled arm for subsequent access and pick-up by a suitable mechanism carried by the arm during automatic assembly operations.

SUMMARY OF THE INVENTION

The success of automatic assembly depends on the constant supply of various components to their respective pick-up stations from where they are accessible to the pick-up mechanism for transportation to the assembly site. Each pick-up operation involves a sequence of precise movements of the arm and pick-up mechanism, namely, gross movement of the arm and pick-up mechanism to the pick-up station; precise and often delicate manipulation of the pick-up mechanism at the station as it goes through the motions required to pick up a component; and gross movement of the arm, pick-up mechanism and, assuming that the pick-up operation was successful, a component from the pick-up station to the assembly site. Clearly, the success of the pick-up operation relies heavily on the component feeder supplying a component at the required time and with it being accurately positioned at the pick-up station.

It is an object of the present invention therefore to provide a component feeder operable, in use, to supply components on demand to a pick-up station with each component aligned and accurately located at the station for subsequent access by the pick-up mechanism.

Although not essential, it is also a desirable feature for the feeder to present components for access by the pick-up mechanism in a plane coincident with, or parallel to, the plan of assembly, so that initial pick-up direction and final placement direction of a component are parallel to each other, thereby avoiding the problems of lack of repeatability and motion time loss involved in the inclining of the pick-up mechanism, which would otherwise be required. Generally, this means in practice that the pick-up station should lie in the horizontal plane.

A variety of feeders of components are available which utilize straight or curved chutes, often with positive displacement actuators to propel a component to its final position at the pick-up station. These mechanisms are invariably complex and consequently expensive. Furthermore, possibly due to their complexity, they often malfunction. An important factor influencing the choice of robotic assembly as opposed to manual assembly is its cost effectiveness. Since robotic devices themselves are generally very expensive, it is important for the cost of all ancilliary equipment, including component feeders to be kept to a minimum.

It is therefore a further object of the present invention to provide a component feeder that is not only reliable in operation, but also of simple construction and therefore of low cost.

The invention provides, a chute for gravity feeding a plurality of like-components to a pick-up station of a robotic controlled arm for subsequent access and pick-up during automatic assembly operations, characterized in that the chute comprises a downwardly inclined first straight section, adapted to receive said plurality of like components at the upper end thereof, the lower end of said downwardly inclined section leading with an abrupt change in direction into a second straight section having an end stop, the second straight section being of a length just sufficient to accommodate one of said components at a time, and constituting said pick-up station from which the components are removed by said arm.

For a better understanding of the present invention, together with other and further advantages and features thereof, reference is made to the description taken in connection with the accompanying drawings, the scope of the invention being pointed out in the appended claims.

BRIEF DESCRIPTION OF THE DRAWINGS

Referring to the drawings.

DETAILED DESCRIPTION

A number of components that are to be assembled to a printed circuit card are generic, of substantially cuboid shape with pins projecting from one surface. In searching for a simple, effective, low cost solution, a feeder for this type of component has been developed which is also useful for feeding other components of the same general body shape with or without pins.

Figure 3:
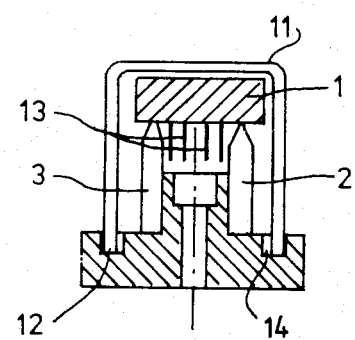
FIG. 3 shows a part-section of the chute of FIG. 2 taken along the line I—I.

Referring to the figures, the feeder chute for feeding components 1 is seen to consist of two guide rails 2 and 3 fabricated from sheet metal and held apart by spacers 4. Each rail is shaped as shown to provide a relatively long downwardly extending straight section (shown generally as section 5 of the chute), inclined at a shallow angle to the horizontal, which terminates at its lower end with a further straight section (shown generally as section 6 of the chute) which is itself horizontal. The upper edges of the rails are chamfered as shown in FIG. 3 with all burrs and sharp edges removed to provide low friction surfaces over which the components 1 can slide freely. The abrupt change in direction from the inclined section 5 to the horizontal section 6 of the chute guide rails is via a small radius curve so as not to impede the free sliding movement of the components past this surface discontinuity.

An end-stop 7, itself incorporating a guide rail spacer, is provided at the open end of the horizontal sections 6 of the guide rails. This horizontal section has a length just sufficient to accommodate one component, and in practice is approximately 0.1 mm longer than the component length. A component is regarded as being at the pick-up station when it is in the horizontal section 6 with one end abutting the end stop 7. The relative inclination of the two sections of the chute is selected to suit the mass and friction characteristics of the component to be fed. In the example shown in FIG. 2 the angle of inclination between the two is 30 degrees, and in general can be expected to lie between 20 and 35 degrees.

Figure 1:
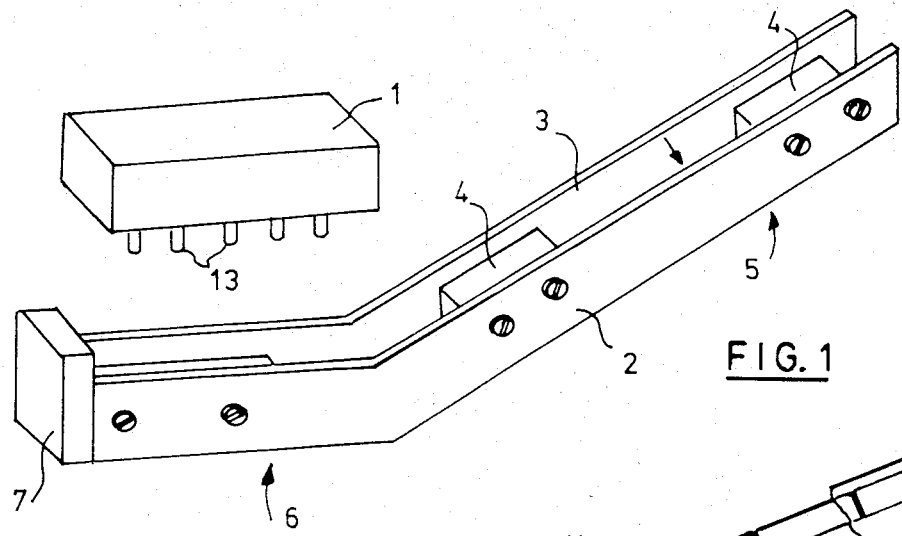
FIG. 1 is a schematic drawing of a chute with top and side restraint removed illustrating the principle employed.
Figure 2:
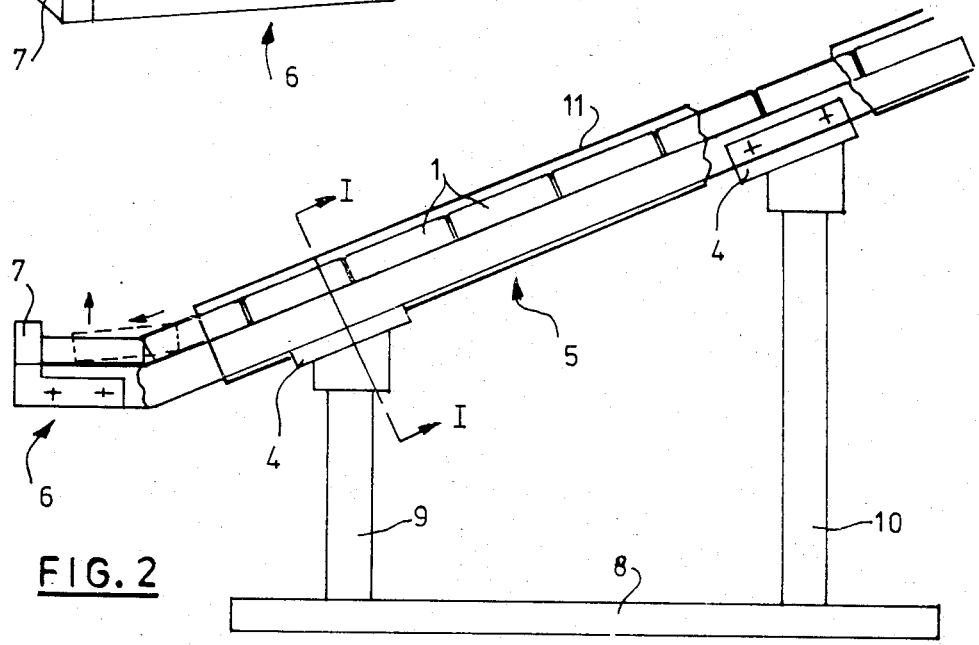
FIG. 2 shows in side elevation a practical chute constructed for feeding electrical components.

The spacers 4 for the guide rails 2 and 3 of the feeder chute shown in FIGS. 2 and 3 are in the form of rectangular blocks to which the rails are screwed. The chute is itself supported from a rigid base plate 8 on two supporting legs 9 and 10 to which the spacer blocks are attached. A clear acrylic cover 11 sprung into slots 12 and 14 provided on either side of each spacer block, as shown in FIG. 3, extends over the major portion of the inclined section 5 of the chute and provides an upper restraint for the components 1 as they slide down towards the pick-up station 6.

In use, components 1 are loaded at the upper end of the chute from a suitable hopper (not shown) with their pins 13 extending downward between the two guide rails 2 and 3. By this means, lateral registration of the component is effected during their passage down the chute. Clearly, a chute for feeding components without pins, such as for example, keybuttons, will require the addition of retaining side members over its entire length to provide lateral restraint for the components as they slide down the chute, and lateral registration of the components in the pick-up station. The side members are conveniently provided by the cover 11 itself along the inclined section of the chute, but only side members must be provided on each side of the chute in the region of the pick-up station to permit access to the components.

As each component in turn is removed from the pick-up station, so the remaining components slide down the inclined section 5 of the chute on the low friction guide rails 2 and 3 and the next component slides in the the pick-up station. During the entire movement into the pick-up station, a component 1 experiences a horizontal force driving it towards the end stop 7. At the point where the friction angle and the angle the component makes with the horizontal are equal (approximately 4 degrees) there is sufficient momentum to complete the motion to the end stop 7 even when the component is the last to be fed. Furthermore, it will be observed that the act of removing a component from the pick-up station has the effect of lifting the leading edge of the next component so aiding its free movement into the pick-up station.

While a preferred embodiment of the invention has been illustrated and described, it is to be understood that there is no intention to limit the invention to the precise construction herein disclosed and the right is reserved to all changes and modifications coming within the scope of the invention as defined in the appended claims.

We claim:

1. A system comprising a plurality of like electrical components and a chute for gravity feeding of said electrical components to a pick-up station for subsequent access and removal by a pick-up mechanism, said electrical components each having a generally cuboid shape and predetermined size and having leading and trailing edges and electrical connection pins (13) extending downwardly from one surface thereof, said chute comprising a downwardly inclined first straight section (5) having a bottom surface, the lower end of said downwardly inclined first straight section leading with an abrupt change in direction into a second straight section (6) serving as a pick-up station from which said electrical components are removed by the pick-up mechanism and having a bottom surface, said second straight section being closely sized to accommodate only one of said electrical components of predetermined size at a time and said chute further having two identical spaced apart parallel guide rails (2,3) extending upwardly from the bottom surfaces of said first and second straight sections of said chute, said guide rails being chamfered on the upper edges thereof to provide low friction surfaces to support said electrical components and shaped to provide a downwardly inclined straight track (5) within said first straight section adapted to receive at its upper end electrical components fed thereto, said track (5) leading abruptly into a horizontal straight track (6) within said second straight section, the second straight section (6) further having an end stop the electrical components feeding closely adjacent one another throughout the length of the chute and the tangential relationship of the first straight section with respect to the second straight section of the chute establishing a condition wherein the leading edge of any electrical component in the chute next in line to enter the second straight section overlaps the trailing edge of any electrical component in the second straight section, the construction and arrangement of the parallel guide rails being such that they are sufficiently spaced to receive therebetween the pins (13) of electrical components supplied thereto but sufficiently close to each other to support the edges of the surface of the electrical component from which the pins extend, whereby the sliding contact between the pins and guide rails provides lateral restraint and registration for the electrical components as they slide in succession down the chute and into the second straight section and whereby access and removal of an electrical component from the second straight section by the pick-up mechanism by virtue of the overlapping of edges of an electrical component next in line and the constraints on lateral movement established due to the close size relationship of the second straight section and an electrical component in the second straight section imparts a lifting action of the electrical component next in line and aids its free movement into the second straight section.

* * * * *